United States Patent [19]

Cheng et al.

[11] Patent Number: 5,501,926
[45] Date of Patent: Mar. 26, 1996

[54] DICHROMATIC PHOTOMASK AND A METHOD FOR ITS FABRICATION

[75] Inventors: John C. Cheng, San Jose; Timothy M. Reith, Morgan Hill; James S. Wong, San Jose, all of Calif.

[73] Assignee: International Business Machines Corporation, Armonk, N.Y.

[21] Appl. No.: 383,553

[22] Filed: Jan. 31, 1995

Related U.S. Application Data

[63] Continuation of Ser. No. 897,627, Jun. 12, 1992, abandoned.

[51] Int. Cl.$^6$ .................... G11B 7/26; G03F 9/00
[52] U.S. Cl. ............... 430/5; 430/323; 430/325; 430/326; 430/328; 430/329
[58] Field of Search .................... 430/5, 323, 325, 430/326, 328, 329

[56] References Cited

U.S. PATENT DOCUMENTS

| | | | |
|---|---|---|---|
| 4,363,116 | 12/1982 | Kleuters et al. | 369/30 |
| 4,469,424 | 9/1984 | Matsui et al. | 354/298 |
| 4,732,844 | 3/1988 | Ota et al. | 430/322 |
| 4,767,723 | 8/1988 | Hinsberg et al. | 437/41 |
| 4,839,251 | 6/1989 | Ohta et al. | 430/5 |
| 4,893,298 | 1/1990 | Pasman et al. | 369/275 |
| 4,953,385 | 4/1990 | Aoki et al. | 72/462 |
| 5,060,223 | 10/1991 | Segawa | 369/275.4 |

FOREIGN PATENT DOCUMENTS

| | | |
|---|---|---|
| 0221514 | 5/1987 | European Pat. Off. . |
| 0220578 | 5/1987 | European Pat. Off. . |
| 3337315 | 10/1982 | Germany . |
| 58-95149 | 6/1983 | Japan . |
| 1116636 | 5/1989 | Japan . |
| 249231 | 2/1990 | Japan . |
| 249230 | 2/1990 | Japan . |

OTHER PUBLICATIONS

Horigome, et al., "Novel Stamper Process for Optical Disc," SPIE vol. 899, Optical Storage Technology and Applications (1988), pp. 123–128.

Hinsberg, et al., "A Lithographic Analog of Color Photography: Self–Aligning Photolithography using a Resist with Wavelength–Dependent Tone," IBM Optical Media, RJ6750 (64597) Mar. 29, 1989, Chemistry.

*Primary Examiner*—James J. Seidleck
*Assistant Examiner*—R. F. Johnson
*Attorney, Agent, or Firm*—Douglas R. Millett

[57] ABSTRACT

A method of manufacturing a photomask for the production of dual depth features on substrates, and the photomask so manufactured, wherein the method of manufacturing the photomask is comprised of the steps of: (1) coating a substrate which transmits at least two selected wavelengths with: a) an optical filter material which prevents the transmission of at least one of the wavelengths, b) an opaque masking material, and c) a dual tone photoresist; (2) using a single mastering tool to selectively expose areas of the coated substrate to one of the wavelengths; (3) developing the photoresist; (4) etching the exposed masking material and optical filter material; (5) exposing the remaining coated substrate; (6) developing the remaining photoresist; (7) etching the exposed surface; and (8) stripping away the remaining photoresist.

13 Claims, 2 Drawing Sheets

DICHROMATIC PHOTOMASK AND A METHOD FOR ITS FABRICATION

This application is a continuation of Ser. No. 897,627, filed Jun. 12, 1992, now abandoned.

FIELD OF INVENTION

This invention relates generally to the field of photolithography and, more specifically, to a dichromatic photomask and a method of fabricating same.

BACKGROUND OF THE INVENTION

A number of techniques are known to be capable of fabricating features on substrates. As technologies evolve, however, new requirements develop, demanding novel approaches. This invention comprises a novel photomask capable of answering some of these new requirements.

One of the newly evolving technologies is optical disk fabrication. Fabricating an optical disk requires the formation of a spiral or concentric pattern of pits and grooves on the disk's surface. The "data pits" carry read-only track and sector information. The grooves are used as guiding tracks for the optical read head.

Information recorded by means of the data pits is read by an optical read head which senses the light reflected back from the disk. The depth of the pit is critical. If this depth is approximately one fourth of the wavelength of the light, the distance traveled by the light reflected from the bottom of the pit will be approximately one half of a wavelength longer than the path of light reflected from other areas. The difference in path length will result in phase interference of the light wave. This makes it easier to distinguish light reflected from the data pits as compared with the light reflected from the other surface areas of the disk.

In contrast to the data pits, the grooves do not require great depth. In fact, for optimal tracking servo performance, it is preferable that grooves be more shallow than the data pits. Accordingly, current optical disk technology requires the production of substrates with dual-depth features, that is, substrates having pits and grooves which have two different, well-controlled depths.

Optical disk fabrication also provides an example of an emerging requirement for different substrate materials. Today, plastic is most commonly used in optical disks. However, as the technology evolves, it will be advantageous to use glass. Glass is stronger than plastic, being generally more resistant to wear and capable of withstanding high speed rotation. In addition, glass remains free from discoloration as it ages, thus giving glass substrates a longer useful life. Finally, glass has a low birefringence, i.e. when light with different directions of polarization is directed through a glass substrate, the substrate will not show different refractive index properties depending on the direction. This results in a better focused beam at the recording layer and hence an ability to more accurately read and write the information on the disk.

As can be seen from this consideration of optical disk technology, there is a need for an efficient method of fabrication which is able to produce dual-depth features on glass substrates.

In prior art, two common methods were commonly used to fabricate features on substrates: stamping and photolithography (using either direct-write techniques or photomasks).

a. Stamping

Stamping, as its name implies, uses a master form or stamper to impress patterns on the surface of a substrate. It is known to those skilled in the art that dual-depth pits and grooves could be produced by stamping on an optical disk substrate. (See, for example, a discussion by Horigome et al in *Novel Stamper Process for Optical Disc*, SPIE, Vol. 899, Optical Storage Technology and Applications, 1988, page 123.) The process does, however, have certain drawbacks. Commonly, either a plastic substrate or a photopolymer (2p) layer on top of a glass substrate is stamped. Stamping the glass substrate itself requires high temperatures and pressure. (See, for example, U.S. Pat. No. 4,953,385, Aoki et al, Information Storage Stamper and Method of Manufacturing Disks Using the Same). As a result, stamping glass is not energy efficient.

b. Photolithography

In photolithography, a substrate is coated with a photoresist. Certain areas of the photoresist are exposed to light so that the exposed areas form a desired pattern. When the photoresist is developed, the exposed photoresist will dissolve faster and uncover the substrate beneath it. If the surface of the now partially coated substrate is etched, only the uncovered areas of the substrate will be affected since the remaining photoresist protects the areas beneath it. As a result, the pattern originally produced on the photoresist is reproduced on the substrate.

i. Direct-Write Processes

In a Direct-Write process, the patterns are traced on the photoresist with a "mastering tool," such as a laser. The photoresist is then processed using the photolithographic techniques described above. Direct-Write techniques have an advantage over stamping in that these techniques could be applied easily to either glass or plastic substrates. However, since the patterns must be traced individually, this process is more time consuming and expensive than stamping.

ii. Photomasks

Photomasks have opaque and transparent areas set in a predetermined pattern. In photolithographic processes using photomasks, the photomask is positioned between a light source and the target substrate. The light passes through the photomask to expose photoresist on the substrate surface in the same pattern as the photomask.

Photomasks have an advantage over direct-write photolithography in that, once a suitable photomask has been constructed, it can be used to mass produce optical disk substrates. Thus, the problem of fabricating dual-depth features on glass substrates resolves itself into developing (and fabricating) an adequate photomask to accomplish this objective.

Multiple Photomasks

Photomasks capable of producing a single-depth feature on an optical disk substrate are well known in the art. It is also known that, if two of such photomasks are used with two successive exposures, dual-depth features can be produced. (The first photomask creates the first set of single-depth features. The second photomask is used to deepen some of the features created in the first step.)

While simple in theory, a procedure using multiple photomasks presents significant difficulties in practice. To ensure the resulting pattern is correct, each photomask must be precisely aligned with the pattern formed by its predecessor. As a result, this technique is viable only for features requiring alignment tolerances greater than one micrometer.

Photomasks produced by direct write techniques.

Prior art also shows a method of producing photomasks capable of creating dual-depth features on substrates in which the photomask is fabricated using a direct-write technique. For example, U.S. Pat. No. 4,839,251 (*Photo-Mask for Use in Manufacturing an Optical Memory Disc, a Method for Making the Photo-Mask and a Method for Manufacturing the Optical Memory Disc*, Ohta, et al.) discloses using two lasers, one weaker in power than the second, to remove different amounts of a film coating a photomask substrate. Light passing through the photomask is attenuated by partially removed film but remains full strength where the film was totally removed. On development, exposed photoresist on the target substrate is removed entirely from areas exposed to the unaffected light, and is only partially removed from areas exposed to attenuated light. Etching the surface of the substrate results in features of different depths depending on the amount of photoresist removed.

The drawback to the Ohta process is that it requires very accurate control of the underexposure of the photoresist during production. Further, the uniformity of illumination will affect the width and depth of a feature simultaneously: shape cannot be completely controlled. Finally, it would require an extreme control over the light intensity to create features with submicron dimensions.

Dichromatic Photomasks

It is known to those skilled in the art that a single "dichromatic" photomask can be used with a dual-tone photoresist to create a dual-depth pattern, thus avoiding alignment problems. (See, for example, European Patent Application 86114063.0, Publication number: 0 220 578 A2, filed Oct. 10, 1986.)

Dichromatic photomasks are masks which have translucent areas with at least two different types of opacity. As a result, portions of a dichromatic mask block out all wavelengths, other portions block out wavelengths of given length 1, and still other portions permit transmission of all wavelengths. (It will be clear to one skilled in the art, that equivalent function could be provided by a dichromatic mask that is capable of 1) blocking out all wavelengths, 2) blocking out wavelengths of given length 1 and 3) blocking out wavelengths of given length 2.)

Dual-tone photoresists are comprised of a matrix resin and two photoactive additives. (See, e.g. West German Patent 3337315.) The first additive, when exposed to radiation of a specific wavelength (or group of wavelengths), causes acceleration of the dissolution of the photoresist during development. The second additive, when exposed, has the opposite effect, causing a deceleration of dissolution. The photoactive additives have the additional property that the dissolution-accelerating additive is activated by at least one narrow bandwidth of radiation which does not activate the dissolution-decelerating additive.

As described in the above cited European application, when a dichromatic mask is used certain areas of the photoresist coated substrate will be exposed to dissolution-accelerating wavelengths while others will be exposed to dissolution-decelerating wavelengths. The areas in which the dissolution is accelerated are etched leaving a pattern. Following the etching, the entire substrate is exposed to light: areas previously exposed to neither accelerating or decelerating wavelengths dissolve and those areas are etched, thus creating dual-depth features on the substrate.

It is therefore clear that a dichromatic photomask could supply a solution of the problem of creating dual-depth features on glass substrates. The remaining step to be solved is an efficient method of fabricating such a photomask.

One method of fabricating a dichromatic mask is disclosed in *A Lithographic Analog of Color Photography: Self-Aligning Photolithography using a Resist with Wavelength-Dependent Tone*, IBM Research Journal 6750 (64597), Mar. 29, 1989. In that publication, Hinsberg et al create a dichromatic mask by first producing an opaque pattern using standard photolithographic techniques and, subsequently, depositing an optical filter medium in a second photolithographic process. Since the dual depth features are produced by the successive application of two, separate patterns, care is required that the second pattern was correctly aligned with the first. In addition, it is the two steps of the process make it extremely difficult to produce sub-micron, dual depth features using this photomask.

SUMMARY OF THE BACKGROUND OF THE INVENTION

As can be seen from the above description, each of the previously known techniques for producing dual depth features on glass substrates has certain disadvantages. Stamping can be used to mass-produce substrates, however, if glass-type substrates are used, the required heat and pressure resulted in significant energy and operational costs. Photolithography using direct-writing avoided the heat and pressure requirements but, since substrates were produced one at a time, had significant manufacturing costs. Photolithography using multiple photomasks could produce features on substrates in a cost-effective manner but had the problem of accurate registration. Dichromatic photomasks had all the benefits of photomask photolithography without the registration problem, however, prior to this invention, production was difficult and sub-micron tolerances could not be achieved. Accordingly:

OBJECTS OF THE INVENTION

It is an object of this invention to provide a dichromatic photomask which may be used to create sub-micron dual-depth features on a substrate, where the depth and width of the features may be independently controlled.

It is another object of this invention to provide a dichromatic photomask which avoids registration problems and may be used in cost-effective mass production of substrates with dual-depth features.

It is a further object of this invention to provide an efficient method of manufacturing the photomask described in the objects above.

Other objects and advantages of the present invention will be apparent to those skilled in the relevant art in view of the following description of the invention, the appended claims and the accompanying drawings.

SUMMARY OF THE INVENTION

In achieving the above mentioned and other objects, advantages and features of the present invention, a dichromatic photomask is produced by a novel manufacturing process. This process is comprised of the steps of: (1) coating a substrate which transmits at least two selected radiation wavelengths with: a) a filter material which prevents the transmission of at least one of wavelengths, b) an opaque masking material, and c) a dual tone photoresist; (2) using a single mastering tool to selectively expose areas of the coated substrate to both wavelengths; (3) developing the photoresist; (4) etching the exposed masking material and optical filter material; (5) exposing the remaining coated substrate; (6) developing the remaining photoresist; (7) etching the exposed masking material; and (8) stripping away the remaining photoresist.

DESCRIPTION OF THE DRAWINGS

The above mentioned and other objects, advantages and features of the invention are described below in greater detail in connection with the drawings wherein.

DETAILED DESCRIPTION OF THE INVENTION

Figure 1:
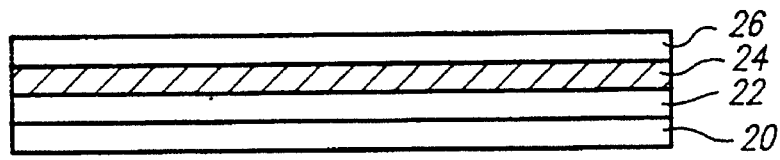
FIG. 1 shows a starting step in the manufacture of the dichromatic photomask of the present invention.

This invention uses the properties of dual-tone photoresist. The particular dual-tone photoresist chosen will affect the other materials used. Specifically, if a dual-tone photoresist is selected which exhibits decelerated dissolution widen exposed to a specific wavelength, wavelength 1, and accelerated dissolution when exposed to wavelength 2, then:

a) a material which is transparent to at least wavelength 1 and wavelength 2 is selected for use as a substrate;

b) a material which prevents transmission of both wavelengths 1 and 2 is chosen as the opaque masking material; and c) a material which prevents transmission of wavelength 1 and allows transmission of wavelength 2 is selected as the required optical filter material.

The process according to the invention will be described with reference to the dual-tone photoresist formulated by dissolving 250 grams of cresol novolac resin in 583 grams of bis(2-methoxyethyl) ether, adding to the solution 38.1 grams of 3.3'-diazidodiphenyl sulfone and 29.3 grams of 4.8 bis[(6-diazo-5.6-dihydro-oxo-1-naphthalenyl) sulfonyloxymethyl]tricyclo-[$5.2.10^{2.6}$]decane, stirring, warming the mixture to 55° C. until all components are dissolved, and filtering after cooling. This photoresist exhibits decelerated dissolution when exposed to ultraviolet light of wavelengths of less than 320 nanometers and accelerated dissolution when exposed to radiation of wavelength greater than 350 nanometers. Other concentrations of the additives may also be used. Other dual-tone photoresists such as those described in European Patent Application 86114063.0, Publication number 0 220 578 A2, filed Oct. 10, 1986, may also be used. This European Patent Application teaches another example of a dual tone photoresist which may be used. The formula comprises 4.5 grams of a cresol novolac resin dissolved in 10.6 grams of bis(2-methoxyethyl) ether. To this mixture was added 0.48 grams of 4.8-bis[(6-diazo-5.6-dihydro-5-oxo-1-naphthalenyl)sulfonyloxymethyl] tricyclo [$5.2.10^{2.6}$]decane and 0.23 grams of compound R550-09 (a 2.5 bis(azido-phenyl)oxazole, (product of Eastman Kodak). The mixture was heated to 55° C. until all material was dissolved, and the resulting liquid was filtered after cooling.

Referring to FIG. 1, a substrate 20 is formed of a material, such as quartz, which is transparent to both wavelength 1 and wavelength 2. (Quartz transmits mid-ultraviolet radiation or wavelengths greater than 280 nm.) Typically, the substrate is formed in a disk-like shape.

The quartz substrate 20 is cleaned in a commercially known manner and a layer of an optical filter material 22 such as $TiO_2$ is formed on the substrate by either a thermal growing technique or thermal, chemical-vapor deposition. If the dual tone photoresist chosen for the manufacture of optical disks utilizing the photomask herein is the same as those disclosed above, $TiO_2$ may be used as the optical filter material since it prevents transmission of ultraviolet light of less than 300 nm and passes ultraviolet light of greater than 400 nm, thereby matching the spectral response curves of the positive and negative photosensitizers of the chosen dual tone photoresist. The thickness of the layer 22 of optical filter material is between 800 and 1000 Å. Conventional techniques such as those used in semiconductor processing may be used to grow the layer 22. It should be appreciated that if the oxide is deposited directly on the quartz, the process need not rely on any metal adhesion properties.

A layer of opaque material 24, such as chromium, is deposited on the surface of the layer of optical filter material 22 using a known method, e.g. evaporation. The thickness of the opaque material layer 24 is greater than 800 Å. Other optically opaque materials such as aluminum may also be used. It should be noted that neither the substrate nor its three layers are drawn to scale.

Finally, a layer 26 of the selected dual-tone photoresist is applied to the surface of the opaque material using a known method, e.g., spin coating. A typical thickness is between 1 and 3 microns but other thicknesses may be used. The final four layer structure (comprising the substrate with its three layers) is shown in FIG. 1.

Figure 2:
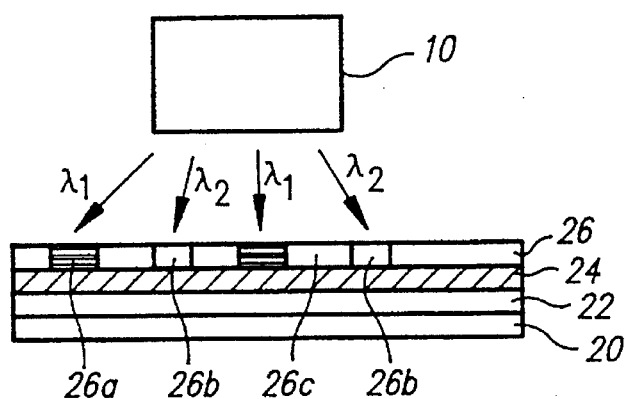
FIG. 2 shows an exposing step in the manufacture of the photomask of the present invention.

In FIG. 2, the structure is selectively exposed to light from source 10. Specifically, selected areas 26a of the layer of photoresist 26 are exposed to wavelength 1 ($\lambda_1$) and other areas 26b are exposed to wavelength 2 ($\lambda_2$). (The exposed areas are chosen so that some portions 26c of the photoresist are not exposed to either wavelength.) The exposure may be performed by using a single mastering tool 10 which is capable of emitting, as required, either wavelength 1 or wavelength 2. Highly precise mastering tools are commercially available with two beams of a single wavelength as, for example, the Panasonic Laser Cutting Machine. Modification of the second beam to emit a second wavelength would provide the required tool, allowing simultaneous or near simultaneous exposure of both the positive and negative photosensitizers of the dual-tone photoresist. Other alternatives would be obvious to one skilled in the art.

Figure 3:
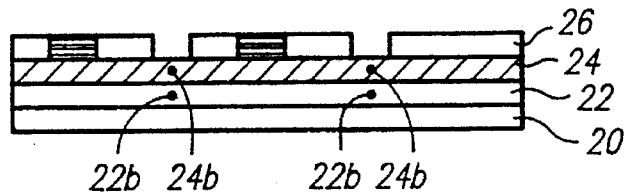
FIG. 3 shows a developing step in the manufacture of the photomask of the present invention.

At the next step, the layer of photoresist 26 is developed by treatment with a conventional developer or solvent which allows removal to occur at those areas 26b of the photoresist which were exposed to wavelength 2 (and accordingly exhibit accelerated dissolution). This process will expose the areas 24b of the layer of opaque masking material 24 immediately beneath areas 26b. The result is shown in FIG. 3.

Figure 4:
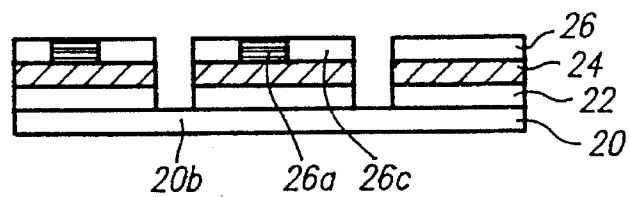
FIG. 4 shows an etching step in the process of manufacture of the photomask of the present invention.

The exposed area 24b of the layer of opaque masking material is then etched using a conventional method such as reactive ion etching (RIE), standard aqueous etching, or sputter etching. The etching is performed until the filter material 22b immediately under the exposed areas 24b of the opaque masking material is etched through. As a result, the underlying areas 20b of the quartz substrate are exposed. The result is shown in FIG. 4. It will be observed that the photoresist remaining after etching was either a) previously exposed to wavelength 1 26a or b) exposed to neither wavelength 1 nor wavelength 2 26c.

Figure 5:
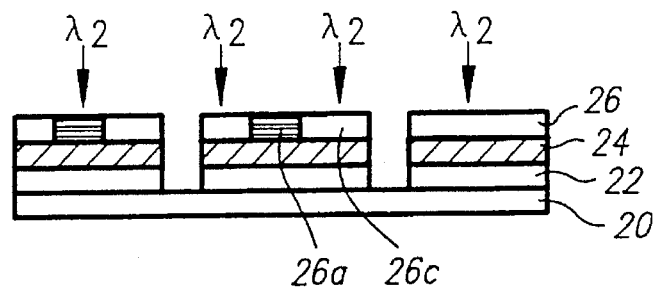
FIG. 5 shows a second exposing step in the manufacture of the photomask of the present invention.

At the next step, the remaining photoresist and the exposed substrate are exposed to wavelength 2 ($\lambda^2$), as shown in FIG. 5. Those areas 26c previously exposed to neither wavelength will, subsequent to this exposure, exhibit accelerated dissolution characteristics.

Figure 6:
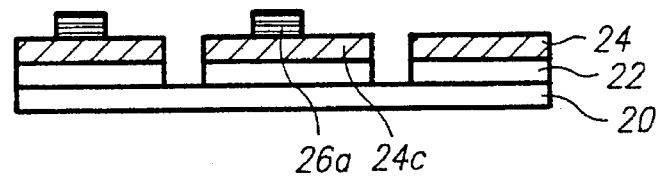
FIG. 6 shows a second developing step in the manufacture of the photomask of the present invention.

Following the flood exposure, the remaining photoresist is developed according to a conventional method which allows removal to occur at the areas 26c of the photoresist which exhibit accelerated dissolution characteristics. Those areas 26a of photoresist originally exposed to wavelength 1 still remain. The result is shown in FIG. 6.

Figure 7:
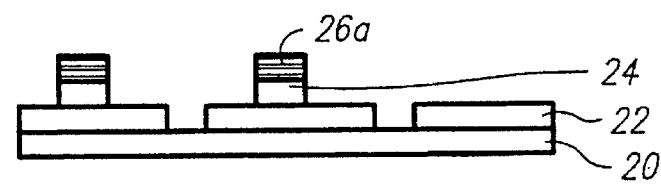
FIG. 7 shows a final step in the manufacture of the photomask of the present invention.

The newly exposed surface 24c of the opaque masking material is etched according to a conventional method which removes the opaque masking material but either leaves unaffected or does not remove entirely the underlying substrate which was exposed in the previous etching step. The result is shown in FIG. 7. Only the areas of photoresist 26a originally exposed to wavelength 1 remain.

Figure 8:
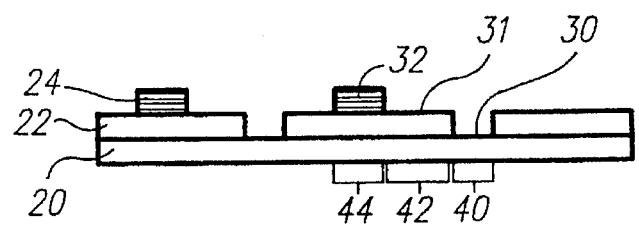
FIG. 8 shows a sectional view of a dichromatic photomask produced according to the method of the current invention.

The remaining photoresist 26a is developed and removed by conventional techniques. The result, shown in FIG. 8, is a dichromatic photomask having a base or floor level 30 from which protrude features of two different heights (dual depth features). The shorter features 31 correspond to areas which received no initial exposure. The taller features 32 were exposed to wavelength 1. The base or floor level 30 received only wavelength 2. Since the photomask is comprised of layers that are transparent to a bandwidth that activates the dissolution-decelerating additive of a given dual-tone photoresist 20, layers that are opaque to that bandwidth, but transparent to other bandwidths 22, and opaque areas 24, the photomask has areas 44 which will prevent any transmission of light, areas 42 which prevent transmission of the dissolution-decelerating wavelength, and areas 40 which will allow transmission of the dissolution-decelerating wavelength.

Although the process for manufacturing a dichromatic mask described above uses a quartz substrate and a layer of $TiO_2$, other substrate materials, other optical filters and other opaque masking materials may be used. For example, the optical filter material may chosen from metal oxide films which are transparent at visible wavelengths but begin absorbing strongly at different wavelengths in the ultraviolet region. The point at which transmission sharply decreases for these materials is known as the cutoff wavelength. The following are examples of such films: $Al_2O_3$ (Cutoff wavelength approximately 250 nm), $CeO_2$ (Cutoff wavelength 400 nm), $HfO_2$ (Cutoff wavelength approximately 220 nm), $In_2O_3$ (Cutoff wavelength 420 nm), $La_2O_3$ (Cutoff wavelength 220 nm), $Nd_2O_3$, $PbO$ (Cutoff wavelength approximately 380 nm), $Sb_2O_4$ (Cutoff wavelength 340 nm), $SiO_2$ (Cutoff wavelength approximately 205 nm), $SnO_2$ (Cutoff wavelength 350 nm), $Ta_2O_5$ (Cutoff wavelength 310 nm), $ThO_2$ (Cutoff wavelength approximately 220 nm), $TiO_2$ (Cutoff wavelength 380 nm) $Y_2O_3$, (Cutoff wavelength less than approximately 300 nm), and $ZrOH_2Y$ (Cutoff wavelength 340 nm).

The process according to this invention provides good quality photomasks without the expense of a direct-write process or the alignment problems resulting from the use of multiple photomasks. This photomask will allow the depth of a tracking groove on a glass substrate to be varied independently of its width since the depth is controlled by the etching process while the width is determined by the photolithography process. Thus, finer patterns can be created on the optical disk substrate with this invention as compared to standard stamping techniques. Further, the use of this photomask may potentially allow creation of disk substrates where the pitch of the tracking grooves is less than one micron.

It will be recognized by those skilled in the art that some of the above features may be used without other features. It will also be recognized that modifications may be made without departing from the spirit of the invention. Such modifications include, but are not limited to, changes to the materials used for the substrates, optical filters, opaque masking materials and photoresists, the thickness of the various coatings, the method by which the coating is applied to the receiving surface, the type of development used on the photoresist, the type of etching or other treatment applied to the exposed surfaces, etc. It will also be recognized that where the invention refers to a single wavelength, groups of wavelengths could be used without departing from the spirit of the invention.

While this invention has been particularly described and illustrated with reference to a preferred embodiment of a mask to be used to create dual depth features on substrates for optical disk data storage, it will be understood that this invention encompasses other uses for such masks. In particular, it will be understood by those skilled in the art that the invention may also be used to:

1. to create a stamper for producing bipolar patterns on 2P or plastic substrates for optical storage applications;

2. to produce self-aligned features for semiconductor applications;

3. in the fabrication of magnetic read and/or write heads for magnetic disk storage; or 4. in the fabrication of multi-layer printed circuit boards.

Other uses than the above examples are also possible. It will also be understood that materials other than glass may be used for the substrate on which the dual features are produced.

What is claimed is:

1. A process of manufacturing a photomask comprising the steps of:

overlaying an electromagnetic radiation transmissive substrate with an electromagnetic radiation filter layer, the filter layer being comprised of a material which passes electromagnetic radiation of a wavelength which causes acceleration dissolution and which blocks electromagnetic radiation which causes deceleration dissolution in a dual tone photoresist process;

overlaying the filter layer with an electromagnetic radiation blocking layer such that the filter layer is located between the substrate and the blocking layer, the radiation blocking layer comprised of a material which blocks both electromagnetic radiation of a wavelength which causes acceleration dissolution and electromagnetic radiation which causes deceleration dissolution in said dual tone photoresist process;

overlaying the blocking layer with a dual tone photoresist layer, said photoresist layer having at least one dissolution accelerating additive and at least one dissolution decelerating additive;

using a mastering tool to generate electromagnetic radiation of a first wavelength and radiation of a second wavelength and exposing first areas of the photoresist layer to radiation of the first wavelength, second areas of said photoresist layer to radiation of the second wavelength, while leaving third areas of the photoresist layer unexposed to any radiation, the radiation of the first wavelength activating the dissolution decelerating additive of the photoresist layer and the radiation of the second wavelength activating the dissolution accelerating additive of the photoresist layer; and removing the photoresist, blocking and filter layers from the second areas, removing the photoresist layer from the first areas, and removing the photoresist and blocking layers from the third areas.

2. The process of claim 1, wherein the step of removing the layers includes the steps of:

developing the photoresist layer in the second areas;

removing the blocking and filter layers in the second areas;

exposing the photoresist layer in the first and third areas to radiation of the second wavelength;

developing the photoresist layer in the third areas;

removing the blocking layer in the third areas; and stripping away the remaining photoresist layer.

3. The process of claim 1, wherein the removal of the radiation blocking and filter layers is achieved by etching.

4. A photomask produced by a process as described in claim 1.

5. A photomask produced by a process as described in claim 2.

6. A photomask produced by a process as described in claim 3.

7. A process of manufacturing optical disk substrates comprising the steps of:

making a photomask comprising the steps of:

overlaying an electromagnetic radiation transmissive substrate with an electromagnetic radiation filter layer such that the filter layer is located between the substrate and the blocking layer, the filter layer being comprised of a material which passes electromagnetic radiation of a wavelength which causes acceleration dissolution and which blocks electromagnetic radiation which causes deceleration dissolution in a dual tone photoresist process;

overlaying the filter layer with an electromagnetic radiation blocking layer, the radiation blocking layer comprised of a material which blocks both electromagnetic radiation of a wavelength which causes acceleration dissolution and electromagnetic radiation which causes deceleration dissolution in said dual tone photoresist process;

overlaying the blocking layer with a dual tone photoresist layer, said photoresist layer having at least one dissolution accelerating additive and at least one dissolution decelerating additive;

using a mastering tool to generate electromagnetic radiation of a first wavelength and radiation of a second wavelength and exposing first areas of the photoresist layer to radiation of the first wavelength, second areas of said photoresist layer to radiation of the second wavelength, while leaving third areas of the photoresist layer unexposed to any radiation, the radiation of the first wavelength activating the dissolution decelerating additive of the photoresist layer and the radiation of the second wavelength activating the dissolution accelerating additive of the photoresist layer; and removing the photoresist, blocking and filter layers from the second areas, removing the photoresist layer from the first areas, and removing the photoresist and blocking layers from the third areas;

exposing electromagnetic radiation through the photomask to an optical disk substrate coated with a photoresist layer having a dissolution accelerating additive and a dissolution decelerating additive; and removing material from the substrate in accordance with the state of the exposed regions.

8. The process of claim 7, wherein the step of removing the layers includes the steps of:

developing the photoresist layer in the second areas;

removing the blocking and filter layers in the second areas;

exposing the photoresist layer in the first and third areas to radiation of the second wavelength;

developing the photoresist layer in the third areas;

removing the blocking layer in the third areas; and stripping away the remaining photoresist layer.

9. The process of claim 7, wherein the removal of the radiation blocking and filter layers is achieved by etching.

10. The process of claim 1, wherein the filter layer is comprised of a metal oxide.

11. The process of claim 1, wherein the filter layer is comprised of $TiO_2$.

12. The process of claim 7, wherein the filter layer is comprised of a metal oxide.

13. The process of claim 7, wherein the filter layer is comprised of $TiO_2$.

* * * * *